United States Patent [19]

Jordan

[11] Patent Number: 5,581,433
[45] Date of Patent: Dec. 3, 1996

[54] ELECTRONIC CIRCUIT BREAKER

[75] Inventor: Mark G. Jordan, Goffstown, N.H.

[73] Assignee: Unitrode Corporation, Billerica, Mass.

[21] Appl. No.: 231,374

[22] Filed: Apr. 22, 1994

[51] Int. Cl.⁶ .................................. H02H 3/00
[52] U.S. Cl. .................. 361/93; 361/58; 361/94; 361/87
[58] Field of Search ................ 361/18, 58, 60, 361/87, 94, 93, 100, 101

[56] References Cited

U.S. PATENT DOCUMENTS

| | | | |
|---|---|---|---|
| 4,174,496 | 11/1979 | McFall et al. | 323/9 |
| 4,331,997 | 5/1982 | Engel et al. | 361/93 |
| 4,331,998 | 5/1982 | Matsko et al. | 361/93 |
| 4,331,999 | 5/1982 | Engel et al. | 361/94 |
| 4,335,413 | 6/1982 | Engel et al. | 361/93 |
| 4,335,437 | 6/1982 | Wilson et al. | 364/483 |
| 4,338,647 | 7/1982 | Wilson et al. | 361/96 |
| 4,351,012 | 9/1982 | Elms et al. | 361/96 |
| 4,351,013 | 9/1982 | Matsko et al. | 361/96 |
| 4,371,824 | 2/1983 | Gritter | 361/18 |
| 4,377,836 | 3/1983 | Elms et al. | 361/96 |
| 4,377,837 | 3/1983 | Matsko et al. | 361/105 |
| 4,428,022 | 1/1984 | Engel et al. | 361/96 |
| 4,445,183 | 4/1984 | McCollum et al. | 364/483 |
| 4,476,511 | 10/1984 | Saletta et al. | 361/96 |
| 4,539,618 | 9/1985 | Stich | 361/94 |
| 4,544,981 | 10/1985 | Hakoopian | 361/93 |
| 4,631,625 | 12/1986 | Alexander et al. | 361/94 |
| 4,682,264 | 7/1987 | Demeyer | 361/96 |
| 4,689,712 | 8/1987 | Demeyer | 361/96 |
| 4,694,373 | 9/1987 | Demeyer | 361/96 |
| 4,710,845 | 12/1987 | Demeyer | 361/96 |
| 4,717,985 | 1/1988 | Demeyer | 361/96 |
| 4,740,883 | 4/1988 | McCollum | 364/140 |
| 4,751,605 | 6/1988 | Mertz et al. | 361/91 |
| 4,766,416 | 8/1988 | Noujaim | 340/347 |
| 4,780,786 | 10/1988 | Weynachter et al. | 361/87 |
| 4,780,787 | 10/1988 | Dano et al. | 361/96 |
| 4,878,144 | 10/1989 | Nebon | 361/96 |
| 4,996,646 | 2/1991 | Farrington | 364/483 |
| 5,119,265 | 6/1992 | Qualich et al. | 361/18 |
| 5,166,887 | 11/1992 | Farrington et al. | 364/483 |
| 5,170,360 | 12/1992 | Porter et al. | 364/483 |
| 5,185,705 | 2/1993 | Farrington | 364/483 |
| 5,270,898 | 12/1993 | Elms et al. | 361/96 |

Primary Examiner—Jeffrey A. Gaffin
Assistant Examiner—Ronald W. Leja
Attorney, Agent, or Firm—Weingarten, Schurgin, Gagnebin & Hayes

[57] ABSTRACT

A solid state circuit breaker for use in electronic devices which may be connected to an active computer bus. In one embodiment the solid state circuit breaker includes a digital to analog converter by way of which digital control signals are used to set the value at which the circuit breaker determines that a fault condition exists. Fault time is measured from when the fault condition is detected, and when the fault time exceeds a predetermined value, the circuit breaker opens, thereby preventing current flow through the circuit breaker for a second predetermined amount of time. Once this second predetermined amount of time elapses, the circuit breaker again permits current flow, and if a fault condition is determined to continue to exist, the cycle is repeated.

The circuit breaker also includes a current limiting portion which restricts current flow to a maximum permissible value should the current flowing through the circuit breaker attempt to exceed this maximum permissible value. A reverse voltage comparator circuit interrupts current flow through the circuit breaker if the voltage at the output terminal of the circuit breaker exceeds the voltage at the input terminal of the circuit breaker.

19 Claims, 5 Drawing Sheets

*FIGURE 1*

| DAC SECTION | SET VALUES | MIN | TYP | MAX | UNITS |
|---|---|---|---|---|---|
| TRIP CURRENT | CODE = 0000 | | | 0.00 | A |
| | CODE = 0001 | | | 0.00 | A |
| | CODE = 0010 | | | 0.00 | A |
| | CODE = 0011 | | | 0.00 | A |
| | CODE = 0100 | 0.15 | 0.25 | 0.35 | A |
| | CODE = 0101 | 0.35 | 0.50 | 0.65 | A |
| | CODE = 0110 | 0.60 | 0.75 | 0.90 | A |
| | CODE = 0111 | 0.85 | 1.00 | 1.15 | A |
| | CODE = 1000 | 1.06 | 1.25 | 1.43 | A |
| | CODE = 1001 | 1.35 | 1.50 | 1.65 | A |
| | CODE = 1010 | 1.58 | 1.75 | 1.92 | A |
| | CODE = 1011 | 1.80 | 2.00 | 2.20 | A |
| | CODE = 1100 | 2.03 | 2.25 | 2.48 | A |
| | CODE = 1101 | 2.25 | 2.50 | 2.75 | A |
| | CODE = 1110 | 2.47 | 2.75 | 3.03 | A |
| | CODE = 1111 | 2.70 | 3.00 | 3.30 | A |

ELECTRONIC CIRCUIT BREAKER

FIELD OF THE INVENTION

The invention relates to circuit breakers in general and in particular to solid state circuit breakers for use in electronic devices.

BACKGROUND OF THE INVENTION

Circuit breakers typically are used to interrupt power to a device which is drawing current in excess of the maximum current permitted by the circuit breaker. Current in excess of this maximum current value, typically called a "fault", causes the circuit breaker to "trip" or interrupt the current path. Prior art circuit breakers include electromechanical devices and microprocessor controlled devices.

When an electronic device such as a peripheral is connected to a computer bus when the bus is active, or transmitting data, the power drawn by the device in charging its internal capacitors immediately upon insertion may be sufficient to cause a transient voltage to appear on the bus resulting in a bus data error. To prevent such voltage transients from appearing on the bus, it is necessary to limit the inrush current to the peripheral as the peripheral is being attached to the bus. A circuit breaker which is capable not only of protecting against excess current flow but is also capable of limiting the in-rush of current to a peripheral being plugged into an active computer bus and permitting only unidirectional current flow is desired.

SUMMARY OF THE INVENTION

The invention relates to a solid state circuit breaker for use in electronic devices which may be connected to an active computer bus. In one embodiment the solid state circuit breaker includes a fault level setting circuit by way of which digital control signals are used to set the value at which the circuit breaker determines that a fault condition exists when a fault condition is detected, the circuit breaker begins to measure the fault time, or the amount of time which has elapsed since the fault was first detected. When the fault time exceeds a predetermined value, the circuit breaker opens, thereby preventing current flow through the circuit breaker.

Current flow is interrupted for a second predetermined amount of time. Once this second predetermined amount of time has elapsed, the circuit breaker closes again, and again permits current to flow. However, if the fault condition is determined to continue to exist, the circuit breaker begins timing the fault time again and the cycle is repeated.

If the current through the circuit breaker attempts to exceed a predetermined maximum current level, a current limiting circuit restricts current flow to a maximum permissible value. Additionally, a reverse voltage comparator circuit interrupts current flow through the circuit breaker if the voltage at the output terminal of the circuit breaker exceeds the voltage at the input terminal of the circuit breaker.

BRIEF DESCRIPTION OF THE DRAWINGS

This invention is pointed out with particularity in the appended claims. The above and further advantages of this invention may be better understood by referring to the following description taken in conjunction with the accompanying drawing, in which:

DESCRIPTION OF THE PREFERRED EMBODIMENTS

Figure 1:
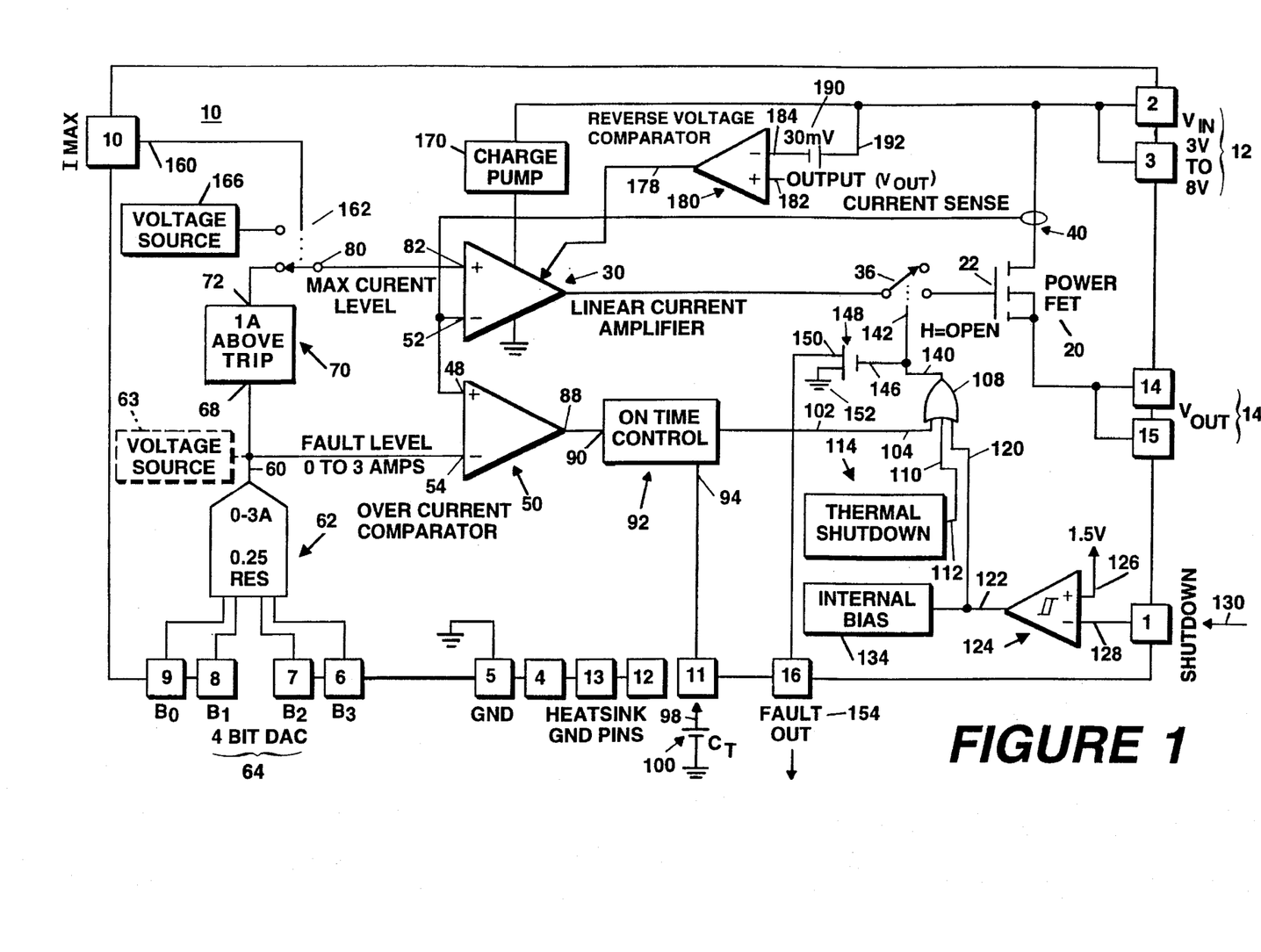
FIG. 1 is a block diagram of an embodiment of the circuit breaker of the invention.

Structure:

An embodiment of the solid state circuit breaker 10 of the invention is shown in FIG. 1. In operation, current flows from the input terminals 12 of the circuit breaker 10 to the output terminals 14 of the circuit breaker 10 through a power MOSFET (FET) 20, when FET 20 is conducting. When FET 20 is conducting, FET 20 emulates an ideal diode in series with a power switch and has a nominal resistance of 0.2 ohms.

Conduction by FET 20 is controlled by a voltage which is applied to gate 22 of FET 20 by a linear current amplifier 30 through a fault switch circuit 36. In one embodiment fault switch circuit 36 is a FET. When a fault condition is not present, fault switch circuit 36 is closed and linear current amplifier 30 maintains FET 20 in a full on state, permitting current to flow from the input terminals 12 to the output terminals 14 of the circuit breaker 10.

Figure 2:
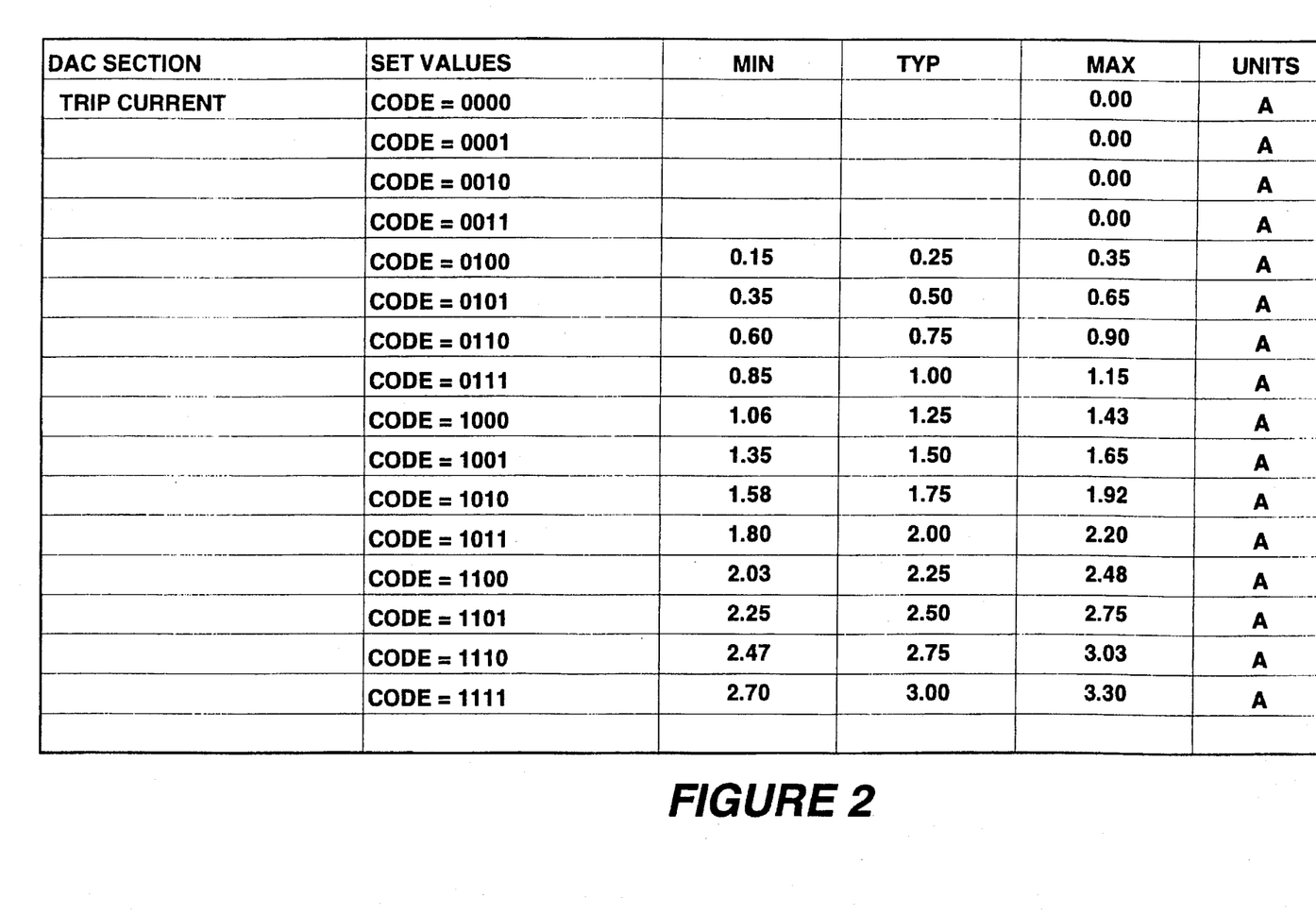
FIG. 2 is a table listing the control values used to set certain parameters of the embodiment of the invention shown in FIG. 1.

The value of the current passing through FET 20 is sensed by a current sensor 40 whose output signal is an input signal to the positive input terminal 48 of an over current comparator 50 and the negative input terminal 52 of linear current amplifier 30. The negative input terminal 54 of over current comparator 50 is connected to the output terminal 60 of a 4-bit digital-to-analog converter (DAC) 62. A digital input signal is applied to the input terminals 64 of the DAC 62 to set the value of the current at which a current fault is to be defined to occur. That is, the analog output signal from DAC 62 corresponds to the fault current level, the value above which current flowing through FET 20 generates a fault condition in the circuit breaker 10. In the embodiment shown, the output signal of DAC 62 may be varied to correspond to 0–3A in 0.25A increments. FIG. 2 is a table listing the values of the input signals to input terminals 64 of DAC 62 and the fault current levels to which such values correspond.

It should be noted that if a settable fault current level is not desired, for example if control lines to apply a digital input signal to the input terminals 64 of the DAC 62 to set the value of the fault current are not available, DAC 62 may be replaced with a voltage source 63 having a voltage corresponding to the fault current level desired. In this manner, a circuit breaker 10 having a fixed fault current level may be fabricated. A variety of circuit breakers, each having a different fixed fault current level, can thus be fabricated to cover the range of fault current values available using a DAC 62.

The output terminal 60 of DAC 62 is also connected to the input terminal 68 of a 1_Amp_Above_Trip circuit 70. The 1_Amp_Above_Trip circuit 70 sets the value of the maximum current which may flow through the circuit breaker 10 to a level equal to one amp above the current fault level set by DAC 62. The output terminal 72 of the 1_Amp_ Above_Trip circuit 70 is connected through a maximum current select switch 80 to the positive input terminal 82 of linear current amplifier 30.

The output terminal 88 of over current comparator 50 is connected to the input terminal 90 of an On_Time_Control circuit 92. One output terminal 94 of On_Time_Control circuit 92 is connected to one terminal 98 of a fault timing capacitor ($C_T$) 100. The second terminal of fault timing capacitor ($C_T$) 100 is connected to ground. A second output terminal 102 of the On_Time_Control circuit 92 is connected to one input terminal 104 of an OR gate 108. An embodiment of On_Time_Control circuit 92 is discussed in detail below.

A second input terminal 110 of OR gate 108 is connected to the output terminal 112 of a thermal shutdown circuit 114. A third input terminal 120 of OR gate 108 is connected to the output terminal 122 of a shutdown comparator 124. The positive input terminal 126 of the shutdown comparator 124 is connected to a 1.5 V supply and the negative input terminal 128 is connected to a shutdown control line 130. The output terminal 122 of shutdown comparator 124 is also connected to the input terminal of an internal bias circuit 134. The internal bias circuit 134 controls power to the circuit breaker 10 and permits the circuit breaker 10 to shut down and thereby reduce power consumption when the shutdown control line 130 is asserted.

The output terminal 140 of OR gate 108 is connected to the control terminal 142 of fault switch circuit 36 and to the gate 146 of a MOSFET 148. The drain 150 of MOSFET 148 is connected to the fault output control line 154 and the source 152 of MOSFET 148 is connected to ground. The fault output control line 154 can be used to report the presence of a fault condition to other devices.

A maximum current control line $I_{max}$ 160 is connected to control terminal 162 of maximum current select switch 80. When the maximum current control line 160 is low, maximum current select switch 80 connects positive input terminal 82 of linear current amplifier 30 to output terminal 72 of 1A_Above_Trip circuit 70. When the maximum current control line is high, maximum current select switch 80 connects positive input terminal 82 of linear current amplifier 30 to a voltage supply 166 whose value corresponds to the value which current sensor 40 would produce when measuring a current flow through FET 20 of 4A.

Charge pump 170 is a voltage multiplier which supplies a sufficient voltage to linear current amplifier 30 so that linear current amplifier 30 is capable of driving gate 22 of FET 20 to its maximum conduction. A signal from the output terminal 178 of a reverse voltage comparator 180 also controls the output signal of linear current amplifier 30. The positive input terminal 182 of reverse voltage comparator 180 is connected to circuit breaker output terminal 14 and the negative input terminal 184 is connected to the negative terminal 186 of a bias voltage 190. The positive terminal 192 of bias voltage 190 is connected to circuit breaker input terminal 12.

Figure 3:
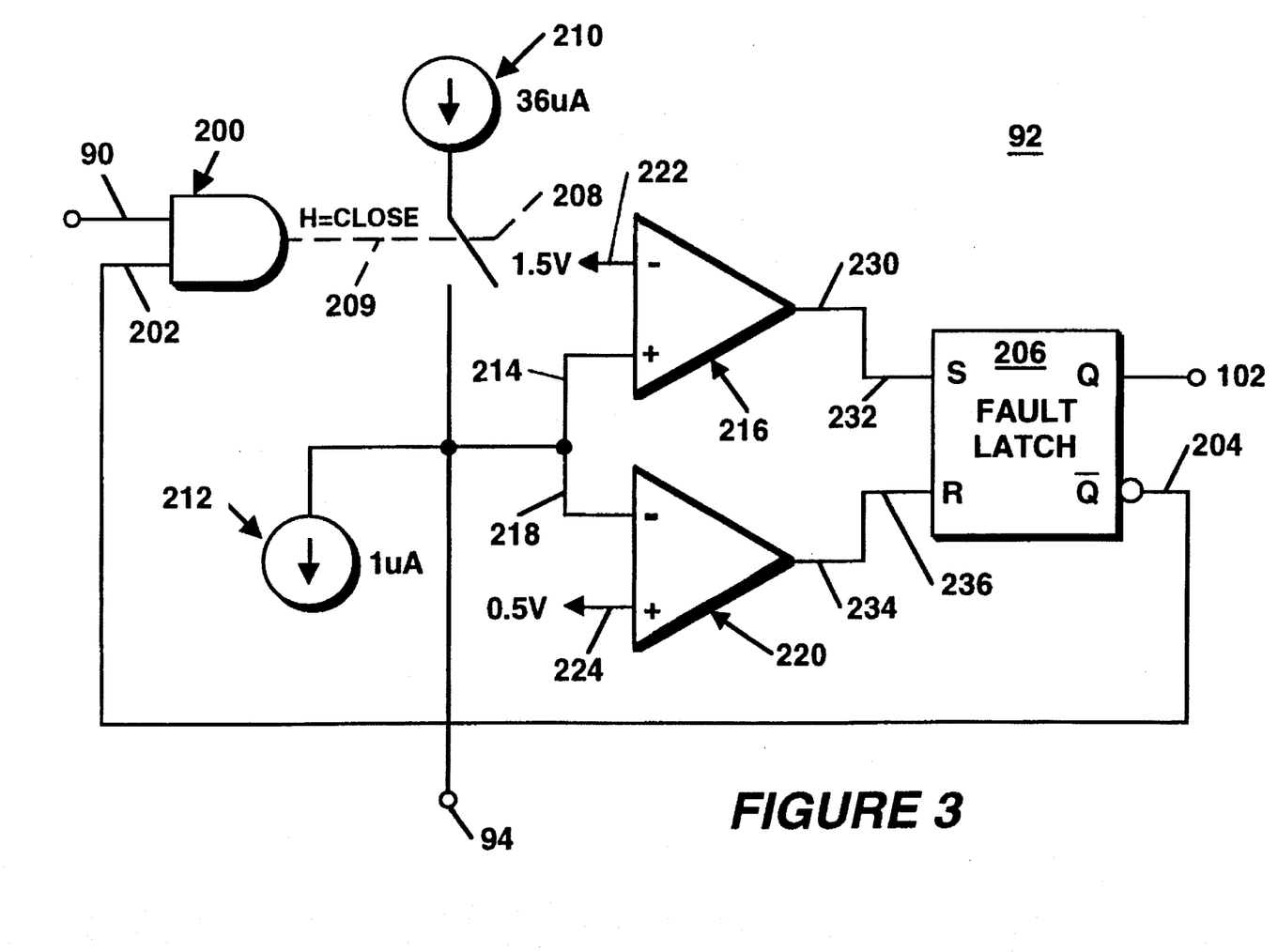
FIG. 3 is a block diagram of an embodiment of an On_Time_Control circuit used in the embodiment of the circuit breaker of the invention shown in FIG. 1.

A block diagram of an embodiment of On_Time_Control circuit 92 is show in FIG. 3. The input signal from the output terminal 88 of over current comparator 50 is an input signal to one input terminal 90 of an AND gate 200, which is also input terminal 90 of On_Time_Control circuit 92. The other input terminal 202 of AND gate 200 is connected to the NOT-Q output terminal 204 of a fault latch 206. The other output terminal Q 102 of fault latch 206 is the second output terminal 102 of the On_Time_Control circuit 92.

The output of AND gate 200 is connected to the control terminal 209 of charging switch 208. When charging switch 208 is closed, output terminal 94 of On_Time_Control circuit 92 is connected to a 36 μA source 210.

Output terminal 94 is also connected to a 1 μA sink 212, the positive input terminal 214 of a maximum value comparator 216, and the negative input terminal 218 of a minimum value comparator 220. The negative input terminal 222 of maximum value comparator 216 is connected to a 1.5 V supply and the positive terminal 224 of the minimum value comparator 220 is connected to a 0.5 V supply. Output terminal 230 of the maximum value comparator 216 is connected to the SET terminal 232 of fault latch 206 and output terminal 234 of minimum value comparator 220 is connected to the RESET terminal 236 of fault latch 206.

Operation:

In brief overview, when the current passing through circuit breaker 10 is less than the fault current as set by DAC 62, fault switch circuit 36 is closed and linear current amplifier 30 supplies gate 22 of FET 20 with the maximum voltage from charge pump 170, causing FET 20 to be at maximum conductance. When the current passing through circuit breaker 10 exceeds the fault current level as set by DAC 62, linear current amplifier 30 maintains FET 20 at maximum conductance and On_Time_Control 92 begins timing the presence of the fault by charging capacitor 100. If the fault condition remains once capacitor ($C_T$) 100 charges to a predetermined level, thereby causing On_Time_Control 92 to time out, On_Time_Control 92 causes fault switch circuit 36 to open, interrupting current flow through circuit breaker 10 thereby removing the fault condition. The fault switch circuit 36 remains open until capacitor ($C_T$) 100 discharges.

Once capacitor ($C_T$) 100 discharges through current sink 212, On_Time_Control 92 causes fault switch circuit 36 to close thereby again permitting current to flow through circuit breaker 10. If the cause of the fault condition has been removed, current is permitted to continue to flow through circuit breaker 10 but if the fault continues, the current exceeds the fault level and the On_Time_Control 92 again times the presence of the fault by charging capacitor ($C_T$) 100. Again, capacitor ($C_T$) 100 charges to its predetermined value and the discharge cycle repeats.

If however the current through circuit breaker 10 continues to rise above the fault level and attempts to exceed the maximum current level permitted as determined by maximum current control line 160, linear current amplifier 30 adjusts the voltage on the gate 22 of FET 20 so as to cause FET 20 to restrict the current through circuit breaker 10 to the maximum current level. At the same time, On_Time_Control 92 again times the fault as previously discussed.

Thus, circuit breaker 10 permits current to flow up to the maximum current level permitted, at which time circuit breaker 10 maintains the current at the maximum current permitted until the fault time is exceeded. Once the fault time is exceeded, circuit breaker 10 interrupts current flow for a predetermined period of time and then permits current to flow again. This cycle repeats until the fault is removed.

Circuit breaker 10 therefor permits current in excess of the fault level to be drawn for a predetermined period of time. Once this period of time, the fault time, is exceeded, circuit breaker 10 interrupts current flow for a predetermined period of time, thereby removing the fault condition. If the fault condition persists, the cycle of permitting current flow and interrupting current flow is repeated.

In more detail and referring first to FIG. 1, the first condition to be considered is one in which the current flowing through FET 20 is below the fault current level as set by the signal applied to the input terminals 64 of DAC 62. With this current flowing through FET 20, the output signal from current sensor 40 applied to the positive input terminal 48 of over current comparator 50 is less than the output signal on the output 60 of DAC 62 as applied to negative input terminal 54 of over current comparator 50. As a result, the output signal from over current comparator 50 is set low. Since the output signal from the over current comparator 50 is low (that is, a no-fault condition), the input signal to the On_Time_Control 92 is low.

Referring again also to FIG. 3, when the input signal to the On_Time_Control 92 is low and hence the input signal to AND gate 200 is low, the output of AND gate 200 is low and hence charge switch 208 is open. Capacitor ($C_T$) 100 is therefore initially discharged by its connection to the 1 μA current sink 212. Hence, the positive input signal to maximum value comparator 216 and the negative input signal to minimum value comparator 220 are both low. Because the negative input signal to minimum value comparator 220 is less than the reference voltage 0.5 V applied to the positive terminal 224 of the minimum value comparator 220, the output signal on the output line 234 of minimum value comparator 220 is set high, resetting fault latch 206. This reset causes the output signal on second output line 102 from the fault latch 206 to go low. Thus, the output signal levels on the output terminals 94 and 102 of On_Time_Control circuit 92 are both low, as is the input signal on input terminal 104 of OR gate 108.

Assuming that the signal from the output terminal 112 of the thermal shutdown circuit 114 is low (indicating that there is no overheating of the circuit breaker 10) and that the shutdown control line 130 is low (indicating there is no external command for shutdown), the output signal on the output terminal 140 of OR gate 108 is also set low. A low signal on the control line 140 of fault switch circuit 36 sets the switch in a closed position and FET 20 is connected to the output of linear current amplifier 30 and is conductive.

The low output signal of OR gate 108 also controls gate 146 of MOSFET 148 to produce a high impedance on fault output control line 154. This high impedance can then be used to indicate the nofault status of the circuit breaker 10 to other electronic devices such as a light emitting diode (LED).

If the signal from the output terminal 112 of the thermal shutdown circuit 114 is set high, indicating that the circuit breaker 10 is overheating, or if the shutdown control line 130 is set high, indicating there is an external command for shutdown, the output signal on the output terminal 140 of OR gate 108 would also be high. Any of these conditions results in the opening fault switch circuit 36 and the shutting off of FET 20 thereby preventing current from flowing from circuit breaker input terminals 12 to output terminals 14. Further, since the output signal of OR gate 142 is high, FET 148 presents a low impedance to fault output control line 154 indicating the presence of a fault condition.

If the maximum current control line $I_{max}$ 160 is set low, maximum current select switch 80 connects the positive input terminal 82 of linear current amplifier 30 to the output terminal 72 of 1A_Above_trip circuit 70. The value of the output signal from 1A_Above_Trip circuit 70 is equal to the value of the current fault level as set by DAC 62 plus one amp. Since the value of the current sensed by current sensor 40 in this first condition is less than the value of the current fault level plus one amp, the output voltage of linear current comparator 30 is set to maximum, thereby making the FET 20 as conductive as possible.

If the maximum current control line $I_{max}$ 160 is set high, the maximum current select switch 80 connects the positive input terminal 82 of linear current amplifier 30 to a voltage source 166 which has a value corresponding to the voltage produced by current sensor 40 when measuring current flow through FET 20 of 4 A. Thus, when the maximum current control line $I_{max}$ 160 is set high, the maximum current level is fixed at 4 A and is independent of the value of the fault current level set by DAC 62.

The condition considered is one in which the current passing through FET 20 rises above the fault current level set by the input signal to DAC 62, but is less than the maximum current level as set by the maximum current control line $I_{max}$ 160 under this condition, the output signal at the output terminal 88 of over current comparator 50, goes high.

Once the output signal at the output terminal 88 of over current comparator 50 goes high, and hence the input signal to AND gate 200 is set high, charge switch 208 closes, connecting output terminal 94 to a 36 μA source 210. Output terminal 94 of the On_Time_control circuit 92 then begins to charge the fault capacitor ($C_T$) 100. Once the voltage on the capacitor 100 reaches 1.5 V, the output signal from the maximum value comparator 216 goes high, setting fault latch 206 thereby making the output signal on the second output terminal 102 of On_Time_Control circuit 92, high. Once the second output terminal 102 of On_Time_Control circuit 92 is set high, the output of OR gate 108 goes high, opening fault switch circuit 36. Fault switch circuit 36 will remain open until fault latch 206 is reset.

Additionally, as the output signal of fault latch 206 goes high, the NOT-Q terminal 204 of the fault latch 206 goes low, thereby causing the second input 202 of AND gate 200 to go low, opening charge switch 208. Once charge switch 208 opens, capacitor 100 is disconnected from 36 μA current source 210 but remains connected to a 1 μA current sink 212. As a result, capacitor ($C_T$) 100 discharges, causing the voltage at output terminal 94 to decrease. Once the voltage at output terminal 94 decreases below 0.5 volts, the output signal from minimum value comparator 220 goes high, resetting fault latch 206. It takes 35 times as long for capacitor ($C_T$) 100 to discharge through the 1 μA sink 212 as to charge from the 36 μA source 210. This results in a duty cycle of approximately 3%.

Thus, the opening of fault switch circuit 36 causes FET 20 to switch off, thereby preventing current from flowing from the input terminals 12 to the output terminals 14 of circuit breaker 10. In one embodiment, the opening of fault switch circuit 36 also causes gate 22 of FET 20 to be grounded, insuring that FET 20 is turned off. Once the current flow ceases, the fault condition is removed, but the output of the On_Time_Control 92 remains high for 35 times the programmed fault time (the on time of switch 208) as determined by the discharge rate of capacitor ($C_T$) 100, discussed above. As a result, the fault switch circuit 36 remains open until the output of On_Time_Control 92 goes low again. As discussed previously, the fact that the output of OR gate 108 is high, results in the fault output control line 154 being set low, indicating the existence of a fault condition.

Considering next the condition in which the current through FET 20 not only increases above the fault level but reaches the maximum current permitted (either one amp above the fault current level or 4A depending on the signal on the maximum current control line $I_{max}$ 160), linear current amplifier 30 decreases the voltage applied to gate 22 of FET 20, thereby restricting the current flow between the input terminals 12 and the output terminals 14 to the maximum permitted current. Additionally, once the current has risen above fault level, On_Time_Control 92 begins charging capacitor (C$_T$) 100 thereby timing the presence of the fault. Again, On_Time_Control 92, opens switch circuit 36 as discussed previously if the fault remains beyond the fault time. Once fault switch circuit 36 opens, current flow through circuit breaker 10 is interrupted, and capacitor (C$_T$) 100 begins to discharge. Once the capacitor (C$_T$) 100 has discharged, fault switch circuit 36 closes again, and if the fault condition continues, the fault timing cycle repeats. In each fault cycle, the linear current amplifier 30 restricts current flow through the circuit breaker 10 by controlling the voltage to gate 22 of FET 20.

Figure 4:
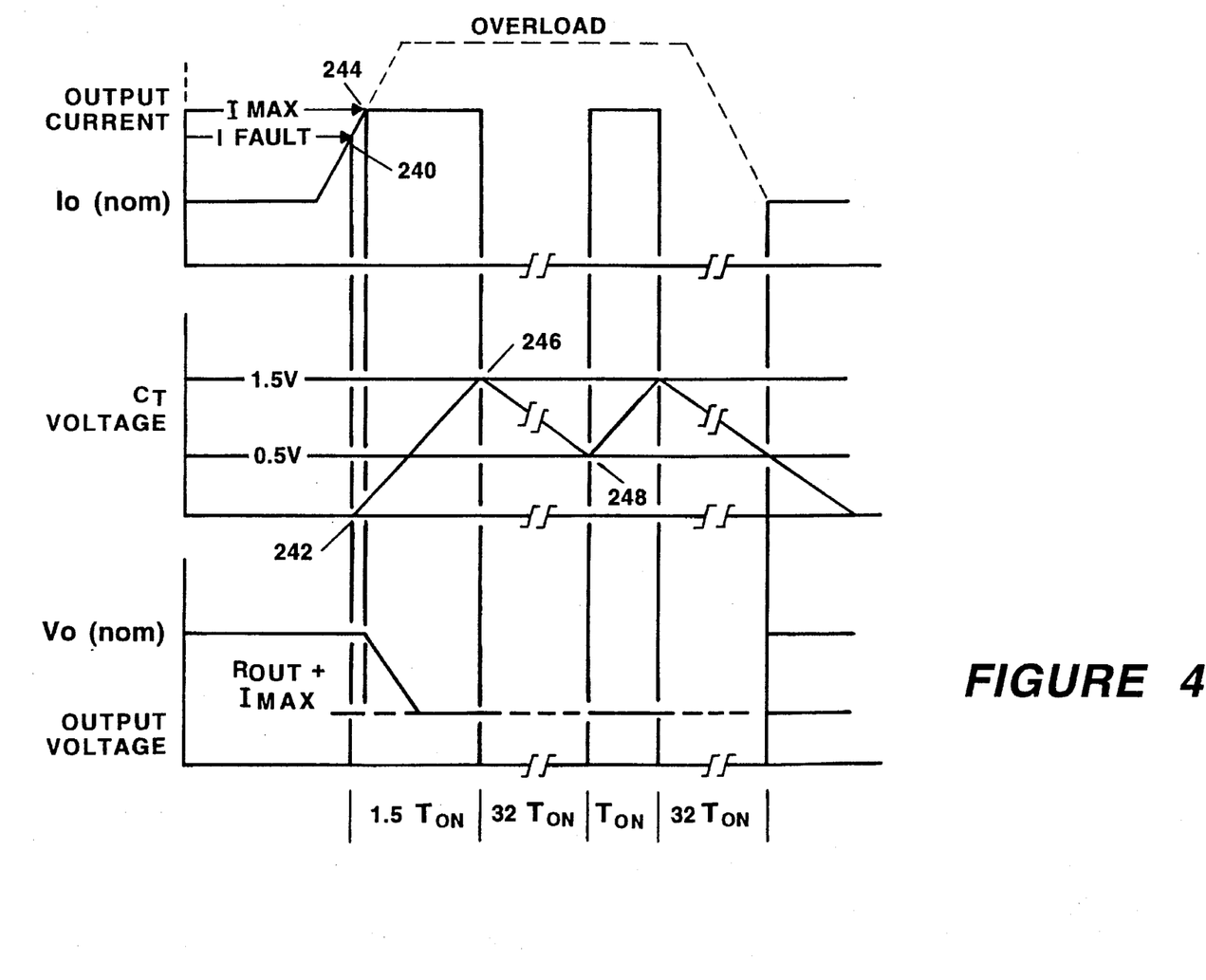
FIG. 4 is a graph of the load current, capacitor voltage and output voltage of the circuit breaker of FIG. 1 under fault conditions.

FIG. 4 is a graph of the current I$_o$ (nom), capacitor voltage (C$_T$ voltage) and output voltage V$_o$ (nom) of this embodiment of the invention under fault conditions. As the current rises to the fault current level 240, the capacitor (C$_T$) 100 begins to charge 242. When the current reaches the maximum current level 244, the linear current amplifier 30 restricts the current to this maximum current level. Once capacitor (C$_T$) 100 reaches 1.5 V, 246, fault switch circuit 36 opens and capacitor (C$_T$) 100 begins to discharge. Once capacitor (C$_T$) 100 reaches 0.5 V, 248, fault latch 206 resets and fault switch circuit 36 closes, and if the fault is still present, the cycle repeats. Thus the circuit breaker 10 will repeatedly attempt to permit current flow, each time limiting the allowed current flow to a maximum permissible value. Such functionality is especially useful for limiting in-rush current when a device is connected to an active bus.

The embodiment of the invention also includes a reverse voltage comparator 180 which compares the voltage at the output terminals 14 of the circuit breaker 10 to the voltage at the input terminals 12 of the circuit breaker minus 30 mV as supplied by the voltage source 190. If the voltage at the output terminals 14 of the circuit breaker 10 is higher than the voltage at the input terminals 12 of the circuit breaker minus 30 mV, the output of the reverse voltage comparator 180 goes high, shutting off the linear current amplifier 30, and thus shutting off FET 20. This prevents the circuit breaker 10 from over driving the bus to which it is being attached.

Figure 5:
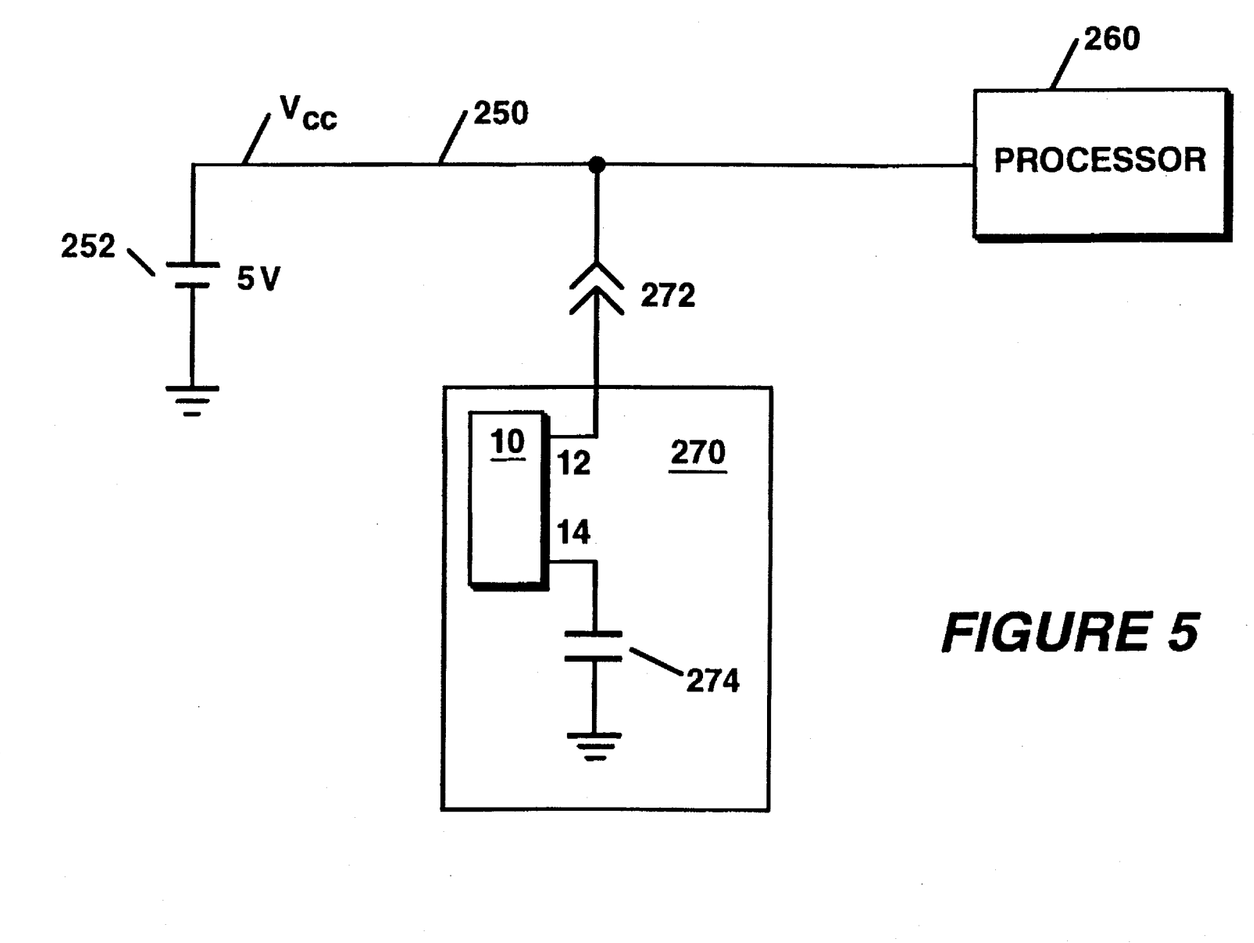
FIG. 5 is a block diagram of the circuit breaker of the invention used in conjunction with an electronic device connected to a computer bus.

FIG. 5 depicts an example of the circuit breaker 10 of the invention used in a peripheral which may be attached to an active bus. In this diagram, a bus 250 having a power supply 252 is connected to a processor 260. A device 270 having the circuit breaker of the invention 10 is connectable to the active bus 250 by a bus connector 272. The device 270, upon attachment to the bus 250 begins to charge its internal capacitance, designated in this drawing by capacitance 274, through the circuit breaker 10.

If the in-rush current to device 270 exceeds the value permitted, the circuit breaker 10 will limit the in-rush current to the maximum permitted.

Having shown the preferred embodiment, those skilled in the art will realize many variations are possible which will still be within the scope and spirit of the claimed invention. Therefore, it is the intention to limit the invention only as indicated by the scope of the following claims.

I claim:

1. A circuit breaker comprising:

a first terminal and a second terminal;

a current switch in series electrical communication with said first terminal and said second terminal of said circuit breaker, said current switch having a control terminal, said current switch having a closed state wherein current is permitted to flow between said first terminal and said second terminal of said circuit breaker and an open state wherein current is prohibited from flowing between said first terminal and said second terminal, said current switch transitioning between said open state and said closed state in response to a control signal applied to said control terminal of said current switch;

a current sensor connected to measure current flow between said first terminal and said second terminal of said circuit breaker, said current sensor having an output terminal and producing a current signal on said output terminal corresponding to said current flow between said first terminal and said second terminal of said circuit breaker;

a fault level setting circuit having an output terminal, said fault level setting circuit providing a fault level signal on said output terminal of said fault level setting circuit; and a comparison and control circuit having a first input terminal in electrical communication with said output terminal of said current sensor, a second input terminal in electrical communication with said output terminal of said fault level setting circuit and an output terminal in electrical communication with said current switch control terminal, said comparison and control circuit causing said current switch to transition from said closed state to said open state a predetermined duration after said current sensor measures current in excess of said fault level signal, wherein said current is in excess of said fault level signal for said predetermined duration, said comparison and control circuit further causing said current switch to restrict current flow between said first terminal and said second terminal of said circuit breaker to a maximum current level permitted to flow between said first terminal and said second terminal of said circuit breaker in response to said current reaching said maximum current level.

2. The circuit breaker of claim 1 wherein said current switch comprises a FET having a gate terminal, a source terminal and a drain terminal, said source terminal being in electrical communication with one of said first terminal and said second terminal of said circuit breaker, said drain terminal being in electrical communication with the other of said first terminal and said second terminal of said circuit breaker, and said gate terminal being said current switch control terminal.

3. The circuit breaker of claim 1 wherein said fault level signal is provided in response to signals applied on said at least one input terminal of said fault level setting circuit.

4. The circuit breaker of claim 3 wherein said fault level setting circuit comprises a digital-to-analog converter circuit having an output terminal and at least one input terminal, said digital-to-analog converter circuit converting a digital signal applied to said at least one input terminal of said digital-to-analog converter circuit to a corresponding analog voltage on said output terminal of said digital-to-analog converter circuit.

5. The circuit breaker of claim 1 wherein said fault level setting circuit is a fixed voltage source.

6. The circuit breaker of claim 1 wherein said comparison and control circuit further comprises:

a fault switch circuit having a control terminal, an input terminal, and an output terminal, said output terminal of said fault switch circuit in electrical communication with said control terminal of said current switch;

a maximum current level circuit having an output terminal, said maximum current level circuit producing a maximum current level signal on said output terminal of said maximum current level circuit proportional to said maximum current level; and a linear current amplifier having a first input terminal in electrical communication with said output terminal of said current sensor, a second input terminal in electrical communication with said output terminal of said maximum current level circuit and an output terminal in electrical communication with said input terminal of said fault switch circuit, said linear current amplifier controlling current flow through said current switch in response to said current measured by said current sensor.

7. The circuit breaker of claim 6 wherein said maximum current level circuit is a fixed voltage source.

8. The circuit breaker of claim 6 wherein said linear current amplifier further includes a control terminal, wherein said first terminal of said circuit breaker is an input terminal having an input voltage, wherein said second terminal of said circuit breaker is an output terminal having an output voltage and wherein said comparison and control circuit further comprises a reverse voltage circuit having a first input terminal in electrical communication with said first input terminal of said circuit breaker, a second input terminal in electrical communication with said second input terminal of said circuit breaker and an output terminal in electrical communication with said control terminal of said linear current amplifier, said reverse voltage circuit providing a signal on said reverse voltage circuit output terminal shutting off said linear current amplifier if said output voltage exceeds said input voltage.

9. The circuit breaker of claim 8 wherein said reverse voltage circuit comprises:

a comparator having a negative input terminal, a positive input terminal in electrical communication with said output terminal of said circuit breaker, and an output terminal in electrical communication with said linear current amplifier control terminal; and a reverse bias source having a negative input terminal in electrical communication with said negative terminal of said comparator and a positive terminal in electrical communication with said input terminal of said circuit breaker.

10. The circuit breaker of claim 6 wherein said maximum current level circuit comprises a current value above fault level circuit having an input terminal and an output terminal, said current value above fault level circuit input terminal in electrical communication with said output terminal of said fault level setting circuit and said current value above fault level circuit output terminal in electrical communication with said second input terminal of said linear current amplifier, wherein said maximum current level signal is selectively provided at said output terminal of said current value above fault level circuit and has a level which is a predetermined amount greater than said fault level signal.

11. The circuit breaker of claim 6 wherein said comparison and control circuit further comprises:

an over current comparator circuit having an output terminal, a first input terminal in electrical communication with said output terminal of said fault level setting circuit, and a second input terminal in electrical communication with said output terminal of said current sensor; and an on time controller having an input terminal in electrical communication with said output terminal of said over current comparator circuit and a control output terminal in electrical communication with said control terminal of said fault switch circuit, said on time controller controlling the state of said fault switch circuit in response to said signal on said output terminal of said over current comparator circuit.

12. The circuit breaker of claim 6 wherein said fault switch circuit comprises a switch having a control terminal, an input terminal in electrical communication with said output terminal of said linear current amplifier and an output terminal in electrical communication with said control terminal of said current switch.

13. The circuit breaker of claim 12 wherein said switch is a FET having a source terminal as said input terminal of said switch, a drain terminal as said output terminal of said switch and a gate as said control terminal.

14. The circuit breaker of claim 6 wherein said linear current amplifier causes said current switch to maintain said current flow between said first terminal and said second terminal of said circuit breaker at said maximum current level if said current sensor measures current flow between said first terminal and said second terminal of said circuit breaker in excess of said maximum current level.

15. The circuit breaker of claim 1 further comprising an internal bias circuit having a control terminal in electrical communication with an external shutdown terminal, said internal bias circuit supplying power to said circuit breaker and shutting off power to said circuit breaker in response to a control signal applied to said external shutdown terminal.

16. The circuit breaker of claim 15 wherein said comparison and control circuit comprises a fault switch circuit comprising a fault switch having a control terminal, an input terminal, and an output terminal in electrical communication with said control terminal of said current switch, wherein said external shutdown terminal is in electrical communication with said control terminal of said fault switch circuit, said fault switch opening in response to said control signal applied to said external shutdown terminal.

17. A circuit breaker comprising:

a first terminal and a second terminal;

a current switch in series electrical communication with said first terminal and said second terminal of said circuit breaker, said current switch having a control terminal, said current switch having a closed state wherein current is permitted to flow between said first terminal and said second terminal of said circuit breaker and an open state wherein current is prohibited from flowing between said first terminal and said second terminal, said current switch transitioning between said open state and said closed state in response to a control signal applied to said control terminal of said current switch;

a current sensor connected to measure current flow between said first terminal and said second terminal of said circuit breaker, said current sensor having an output terminal and producing a current signal on said output terminal corresponding to said current flow between said first terminal and said second terminal of said circuit breaker;

a fault level setting circuit having an output terminal, said fault level setting circuit providing a fault level signal on said output terminal of said fault level setting circuit; and a comparison and control circuit having a first input terminal in electrical communication with said output terminal of said current sensor, a second input terminal in electrical communication with said output terminal of said fault level setting circuit and an output terminal in electrical communication with said current switch control terminal, said comparison and control circuit causing said current switch to transition from said closed state to said open state in response to said current sensor measuring current in excess of said fault level signal, wherein said comparison and control circuit further comprises:

a fault switch circuit having a control terminal, an input terminal, and an output terminal, said output terminal of said fault switch circuit in electrical communication with said control terminal of said current switch;

a maximum current level circuit having an output terminal, said maximum current level circuit producing a maximum current level signal on said output terminal of said maximum current level circuit corresponding to a maximum current permitted to flow between said first terminal and said second terminal of said circuit breaker; and a linear current amplifier having a first input terminal in electrical communication with said output terminal of said current sensor, a second input terminal in electrical communication with said output terminal of said maximum current level circuit and an output terminal in electrical communication with said input terminal of said fault switch circuit, said linear current amplifier controlling current flow through said current switch in response to said current measured by said current sensor;

an over current comparator circuit having an output terminal, a first input terminal in electrical communication with said output terminal of said fault level setting circuit, and a second input terminal in electrical communication with said output terminal of said current sensor; and an on time controller having an input terminal in electrical communication with said output terminal of said over current comparator circuit and a control output terminal in electrical communication with said control terminal of said fault switch circuit, said on time controller controlling the state of said fault control switch in response to said signal on said output terminal of said over current comparator circuit, wherein said on time controller comprises:

a capacitor having a first terminal in electrical communication with ground and having a second terminal;

a current sink having an input terminal in electrical communication with said second terminal of said capacitor;

a current source having an output terminal;

a capacitor switch having a open state and a closed state, said capacitor switch having a control terminal, a first terminal in electrical communication with said output terminal of said current source, and a second terminal in electrical communication with said second terminal of said capacitor; and a capacitor switch control circuit having an input terminal, and output terminal and a capacitor switch control terminal, said capacitor switch control circuit input terminal being said on time controller input terminal, said capacitor switch control circuit output terminal being said on time controller control output terminal, and said capacitor switch control circuit control terminal being in electrical communication with said capacitor switch control terminal, said capacitor switch transitioning between said open state and said closed state in response to a signal applied to said capacitor switch control terminal by said capacitor switch control circuit.

18. The circuit breaker of claim 17 wherein said capacitor switch control circuit comprises:

a first capacitor voltage comparator having an output terminal, a first input terminal in electrical communication with a high current reference voltage, and a second input terminal in electrical communication with said second terminal of said capacitor;

a second capacitor voltage comparator having an output terminal, a first input terminal in electrical communication with a low current reference voltage, and a second input terminal in electrical communication with said second terminal of said capacitor;

a latch circuit having a set terminal in electrical communication with said output terminal of said first capacitor voltage comparator, a reset terminal in electrical communication with said output terminal of said second capacitor voltage comparator, Q-output terminal and a NOT-Q output terminal, said Q-output terminal being said capacitor switch control circuit output terminal; and an AND gate having a first input terminal, a second input terminal, and an output terminal, said first input terminal being said on time controller input terminal, said second input terminal being in electrical communication with said NOT-Q output terminal and said output terminal in electrical communication with said capacitor switch control terminal, said AND gate controlling said capacitor switch in response to a voltage on said capacitor.

19. A circuit breaker comprising:

a first terminal, said first terminal being an input terminal of said circuit breaker;

a second terminal, said second terminal being an output terminal of said circuit breaker;

a FET having a gate terminal, a source terminal and a drain terminal, said source terminal being in electrical communication with one of said first terminal and said second terminal of said circuit breaker, said drain terminal being in electrical communication with the other of said first terminal and said second terminal of said circuit breaker, said FET having a conductive state wherein current is permitted to flow between said first terminal and said second terminal and a non-conductive state wherein current is prohibited from flowing between said first terminal and said second terminal, said FET transitioning between said conductive state and said non-conductive state in response to a control signal applied to said gate terminal;

a current sensor connected to measure current flow between said first terminal and said second terminal of said circuit breaker, said current sensor having an output terminal and producing a current signal on said output terminal corresponding to said current flow between said first terminal and said second terminal of said circuit breaker;

a digital-to-analog converter circuit having an output terminal and at least one input terminal, said digital-to-analog converter circuit providing a fault level signal on said output terminal of said digital-to-analog converter circuit in response to a digital signal applied to said at least one input terminal of said digital-to-analog converter;

a fault switch circuit having a control terminal, an input terminal, and an output terminal in electrical communication with said gate terminal of said FET;

a current value above fault level circuit having an input terminal and an output terminal, said current value above fault level circuit input terminal in electrical communication with said output terminal of said digital-to-analog converter circuit, said current value above fault level circuit producing a maximum current level signal on said output terminal of said current value above fault level circuit corresponding to a maximum current permitted to flow between said first terminal and said second terminal of said circuit breaker;

a linear current amplifier having a control terminal, a first input terminal in electrical communication with said output terminal of said current sensor, a second input terminal in electrical communication with said output terminal of said current value above fault level circuit and an output terminal in electrical communication with said input terminal of said fault switch circuit;

a reverse bias source having a negative terminal and having a positive terminal in electrical communication with said first terminal of said circuit breaker;

a reverse voltage comparator having a positive input terminal in electrical communication with said second terminal of said circuit breaker, an output terminal in electrical communication with said linear current amplifier control terminal and a negative input terminal in electrical communication with said negative terminal of said reverse bias source, said reverse voltage comparator providing a signal on said reverse voltage comparator output terminal to shut off said linear current amplifier if a voltage on said second terminal of said circuit breaker exceeds voltage on said first terminal of said circuit breaker;

an over current comparator circuit having a first input terminal in electrical communication with said output terminal of said digital-to-analog converter circuit, a second input terminal in electrical communication with said output terminal of said current sensor, and an output terminal;

an on time controller having an input terminal in electrical communication with said output terminal of said over current comparator circuit and a control output terminal in electrical communication with said fault switch circuit control terminal, said on time controller controlling the state of said fault switch circuit in response to said signal on said output terminal of said over current comparator circuit; and an internal bias circuit having a control terminal in electrical communication with said control terminal of said fault switch circuit and in electrical communication with an external shutdown terminal, said fault switch circuit opening and said internal bias circuit shutting off power to said circuit breaker in response to a control signal applied to said external shutdown terminal, wherein said linear current amplifier causes said FET to maintain said current flow between said first terminal and said second terminal of said circuit breaker at a maximum current level if said current sensor measures current flow between said first terminal and said second terminal of said circuit breaker in excess of said maximum current, and wherein said fault switch circuit causes said FET to open if said current sensor measures current flow between said first terminal and said second terminal of said circuit breaker in excess of a fault level for an amount of time greater than a predetermined amount of time.

* * * * *

UNITED STATES PATENT AND TRADEMARK OFFICE
CERTIFICATE OF CORRECTION

PATENT NO. : 5,581,433
DATED : December 3, 1996
INVENTOR(S) : Mark G. Jordan

It is certified that error appears in the above-indentified patent and that said Letters Patent is hereby corrected as shown below:

Column 6, line 6, "4 A", should read --4A--.

Column 6, line 8, "4 A", should read --4A--.

Signed and Sealed this

Twenty-fourth Day of March, 1998

Attest:

BRUCE LEHMAN

*Attesting Officer*  *Commissioner of Patents and Trademarks*